(12) United States Patent
Dak et al.

(10) Patent No.: US 10,460,814 B2
(45) Date of Patent: Oct. 29, 2019

(54) NON-VOLATILE MEMORY AND METHOD FOR POWER EFFICIENT READ OR VERIFY USING LOCKOUT CONTROL

(71) Applicant: Western Digital Technologies, Inc., San Jose, CA (US)

(72) Inventors: Piyush Dak, San Jose, CA (US); Mohan Vamsi Dunga, Santa Clara, CA (US); Pitamber Shukla, Milpitas, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/838,863

(22) Filed: Dec. 12, 2017

(65) Prior Publication Data

US 2019/0180823 A1    Jun. 13, 2019

(51) Int. Cl.

| | |
|---|---|
| *G11C 16/26* | (2006.01) |
| *G11C 16/34* | (2006.01) |
| *G11C 16/04* | (2006.01) |
| *G11C 11/408* | (2006.01) |
| *G11C 7/12* | (2006.01) |
| *G06F 3/06* | (2006.01) |
| *G11C 11/4097* | (2006.01) |

(52) U.S. Cl.
CPC ............ *G11C 16/26* (2013.01); *G06F 3/0679* (2013.01); *G11C 7/12* (2013.01); *G11C 11/4085* (2013.01); *G11C 11/4097* (2013.01); *G11C 16/0483* (2013.01); *G11C 16/0491* (2013.01); *G11C 16/34* (2013.01); *G11C 2211/5641* (2013.01)

(58) Field of Classification Search
CPC ....... G11C 11/5642; G11C 16/26; G11C 7/12; G11C 11/4085; G11C 11/4097; G06F 3/0679
See application file for complete search history.

(56) References Cited

U.S. PATENT DOCUMENTS

| | | | |
|---|---|---|---|
| 7,251,160 B2 | 7/2007 | Li et al. | |
| 8,531,889 B2 | 9/2013 | Mokhlesi | |
| 9,208,895 B1 * | 12/2015 | Huynh | ................... G11C 16/24 |
| 2006/0126394 A1 * | 6/2006 | Li | ....................... G11C 11/5628 |
| | | | 365/185.22 |

(Continued)

*Primary Examiner* — Mushfique Siddique
(74) *Attorney, Agent, or Firm* — Patterson & Sheridan, LLP; Steven H. Versteeg

(57) ABSTRACT

Embodiments of the present disclosure generally relate to non-volatile memory devices, such as flash memory, and sensing operation methods including locking out high conduction current memory cells of the memory devices. In one embodiment, a method of sensing a plurality of memory cells in an array includes conducting a lower page read of one or more demarcation threshold voltages. Each memory cell is programmable to a threshold voltage corresponding to one of multiple memory states. A middle page read of one or more demarcation threshold voltages is conducted. Memory cells identified from the lower page read are selectively locked out during the middle page read. An upper page read of one or more demarcation threshold voltages is conducted. Memory cells identified from a prior page read are selectively locked out during the upper page read.

24 Claims, 9 Drawing Sheets

(56) References Cited

U.S. PATENT DOCUMENTS

| | | | |
|---|---|---|---|
| 2006/0209592 A1* | 9/2006 | Li | G11C 11/5642 365/185.03 |
| 2007/0171746 A1* | 7/2007 | Tsao | G11C 7/12 365/207 |
| 2008/0304316 A1* | 12/2008 | Mokhlesi | G11C 16/26 365/185.2 |
| 2008/0304325 A1* | 12/2008 | Mokhlesi | G11C 7/12 365/185.21 |
| 2009/0168540 A1* | 7/2009 | Nguyen | G11C 7/02 365/185.21 |
| 2009/0296488 A1* | 12/2009 | Nguyen | G11C 7/02 365/185.21 |
| 2014/0032992 A1* | 1/2014 | Hara | G06F 12/0246 714/773 |
| 2014/0104943 A1* | 4/2014 | Chen | G11C 11/5642 365/185.03 |
| 2014/0126289 A1* | 5/2014 | Burger | G06F 11/1072 365/185.03 |
| 2015/0071006 A1* | 3/2015 | Harada | G11C 16/10 365/185.22 |
| 2015/0357040 A1* | 12/2015 | Hara | G11C 16/10 365/185.03 |
| 2016/0055916 A1* | 2/2016 | Louie | G11C 16/26 365/185.21 |
| 2016/0098197 A1* | 4/2016 | Kuo | G06F 3/0604 711/103 |
| 2017/0076812 A1* | 3/2017 | Chu | G11C 16/3459 |
| 2017/0097869 A1* | 4/2017 | Sharon | G06F 3/0611 |

* cited by examiner

Fig. 7A

Table 1 (700):

| TABLE 1 | Er | A | B | C | D | E | F | G |
|---|---|---|---|---|---|---|---|---|
| LP | 1 | 0 | 0 | 0 | 0 | 1 | 1 | 1 |
| MP | 1 | 1 | 0 | 0 | 1 | 1 | 0 | 0 |
| UP | 1 | 1 | 1 | 0 | 0 | 0 | 0 | 1 |

Fig. 7B

Table 750:

| READ PAGE | READ LEVEL | STATE OF CELLS DURING DIFFERENT READS IN 2-3-2 READ ||||||||  REDUCTION OF ADDITIONAL MEMORY STATES |
|---|---|---|---|---|---|---|---|---|---|
| | | Er | A | B | C | D | E | F | G (760) | |
| LP | AR | C | NC | NC | NC | NC | NC | NC | NC | - |
| | ER | IC | C | C | C | C | NC | NC | NC | - |
| MP | BR | EIC | C | NC | C | NC | NC | NC | NC | 1/2 |
| | DR | IC | IC | C | C | NC | NC | NC | NC | - |
| | FR | IC | IC | IC | IC | EIC | C | NC | NC | 1/2 |
| UP | CR | EIC | EIC | C | NC | NC | NC | NC | NC | 2/3 |
| | GR | IC | IC | IC | EIC | EIC | EIC | C | NC | 3/4 |

Fig. 9A

| TABLE 2 | Er | A | B | C | D | E | F | G |
|---|---|---|---|---|---|---|---|---|
| LP | 1 | 1 | 1 | 1 | 0 | 0 | 0 | 0 |
| MP | 1 | 0 | 0 | 1 | 1 | 1 | 0 | 0 |
| UP | 1 | 1 | 0 | 0 | 0 | 1 | 1 | 0 |

Fig. 9B

| READ PAGE | READ LEVEL | \multicolumn{8}{c}{STATE OF CELLS DURING DIFFERENT READ FOR 1-3-3 READ} | REDUCTION OF ADDITIONAL MEMORY STATES |
|---|---|---|---|---|---|---|---|---|---|---|
| | | Er | A | B | C | D | E | F | G | |
| LP | DR | C | C | C | C | NC | NC | NC | NC | 0 |
| MP | AR | C | NC | NC | NC | NC | NC | NC | NC | 0 |
| MP | CR | IC | C | C | NC | NC | NC | NC | NC | 0 |
| MP | FR | IC | IC | IC | EIC | C | C | NC | NC | 1/3 |
| UP | BR | EIC | C | NC | NC | NC | NC | NC | NC | 1/2 |
| UP | ER | IC | IC | EIC | EIC | C | NC | NC | NC | 2/3 |
| UP | GR | IC | IC | IC | IC | IC | EIC | C | NC | 1/2 |

NON-VOLATILE MEMORY AND METHOD FOR POWER EFFICIENT READ OR VERIFY USING LOCKOUT CONTROL

BACKGROUND OF THE DISCLOSURE

Field of the Disclosure

Embodiments of the present disclosure generally relate to non-volatile memory devices, such as flash memory, and sensing operations including locking out high conduction current memory cells of the memory devices.

Description of the Related Art

In order to improve read and program performance of memory devices, multiple charge storage elements or memory transistors in an array are read or programmed in parallel. Thus, a "page" of memory elements are read or programmed together. Both reading and verifying operations are performed by executing one or more sensing cycles in which the conduction current or threshold voltage of each memory cell of the page is determined relative to a demarcation value. In general, if the memory is partitioned into n states, there will be at least n–1 sensing passes or levels to resolve all possible memory states. In many implementations, each sensing cycle may also involve two or more passes or levels.

Power consumption is one important consideration of memory devices. With massively parallel sensing, the number of memory cells with conduction current flow will compound. In addition, power may also be consumed in constant voltage bit line schemes which requires a precharge operation during sensing.

Therefore, there is a need for high performance and high capacity non-volatile memory devices with reduced power consumption during sensing operations.

SUMMARY OF THE DISCLOSURE

Embodiments of the present disclosure generally relate to non-volatile memory devices, such as flash memory, and sensing operation methods including locking out high conduction current memory cells of the memory devices.

In one embodiment, a method of sensing a plurality of memory cells in an array includes providing a first series of one or more demarcation threshold voltages for demarcating between memory states. Each memory cell is programmable to a threshold voltage corresponding to one of multiple memory states. One or more sets of memory cells demarcated between the one or more demarcation threshold voltages of the first series are identified. A second series of one or more demarcation threshold voltages for demarcating between memory states is provided. Conduction currents of the one or more sets of memory cells identified by the first series are inhibited during the second series of one or more demarcation threshold voltages. One or more sets of memory cells demarcated between the one or more demarcation threshold voltages of the second series are identified.

In another embodiment, a method of sensing a plurality of memory cells in an array includes conducting a lower page read of one or more demarcation threshold voltages. Each memory cell is programmable to a threshold voltage corresponding to one of multiple memory states. A middle page read of one or more demarcation threshold voltages is conducted. Memory cells identified from the lower page read are selectively locked out during the middle page read. An upper page read of one or more demarcation threshold voltages is conducted. Memory cells identified from a prior page read are selectively locked out during the upper page read.

In one embodiment, a memory device includes an array of memory cells accessible by a plurality of bit lines and a plurality of word lines. A plurality of sensing circuits senses conduction current in a corresponding plurality of memory cells. A bit-line grounding circuit for each sensing circuit grounds associated bit lines to one group of the corresponding plurality of memory cells during a subsequent page read.

In another embodiment, a memory device includes an array of memory cells accessible by a plurality of bit lines and a plurality of word lines. Each memory cell may store a charge level corresponding to eight or more memory states. A sensing means performs a lower page read, a middle page read, and an upper page read. A lockout means locks out a portion of the memory cells during a current page read. The locked out portion of the memory cells are identified from a prior page read.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 7A is a schematic read level chart illustrating one embodiment of a read operation utilizing the method of FIG. 6.

FIG. 7B is a chart illustrating one embodiment of locking out or inhibiting conducting cells during a read level during a read operation following a read scheme of read level chart of FIG. 7A.

FIG. 9A is a schematic read level chart illustrating one embodiment of a read operation discerning the Gray code of FIG. 8.

FIG. 9B is a chart illustrating one embodiment of locking out or inhibiting conducting cells during a read level during a read operation following a read scheme of read level chart of FIG. 9A.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in the claim(s).

Figure 1:
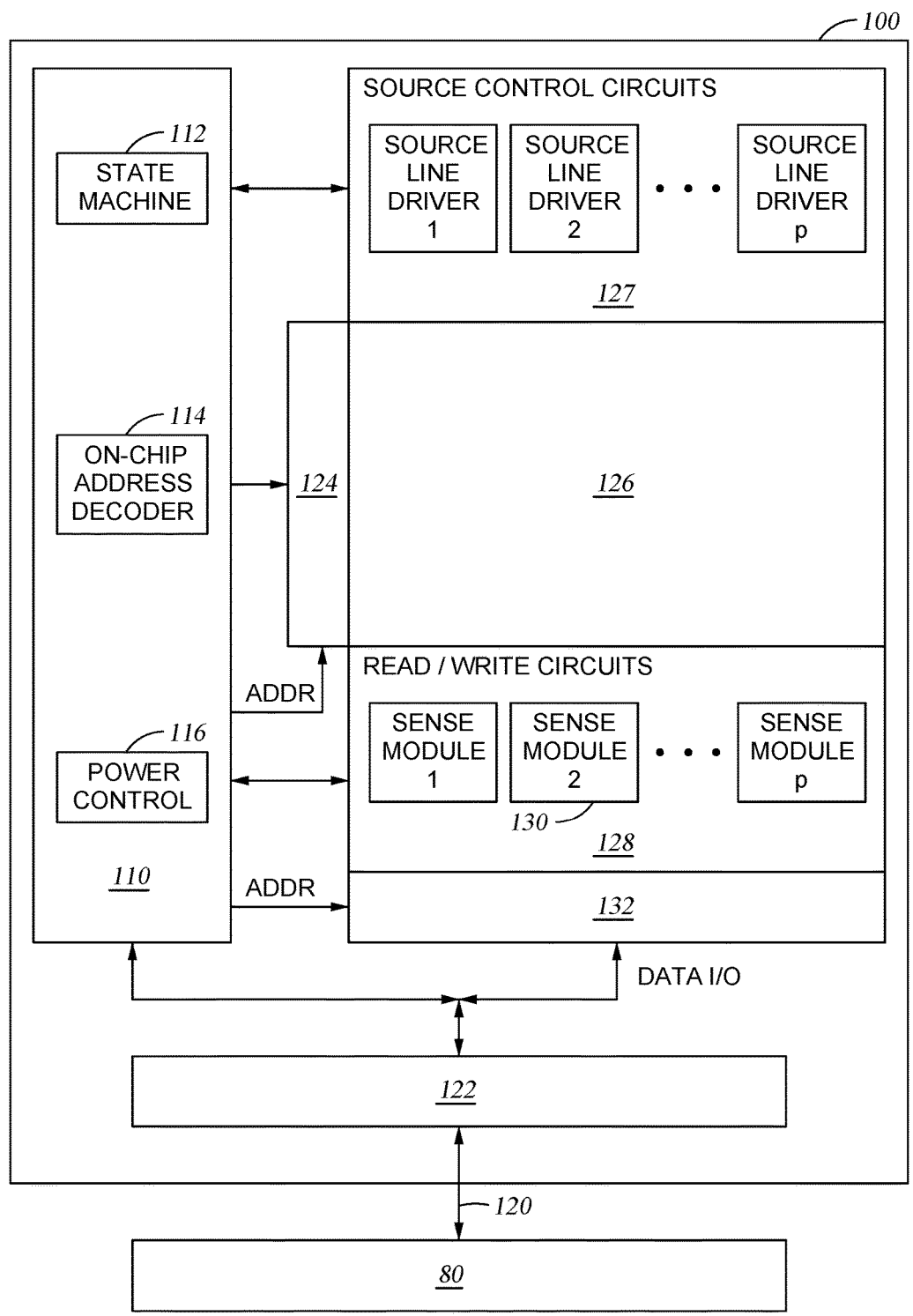
FIG. 1 is a schematic diagram illustrating one embodiment of a memory device.

FIG. 1 is a schematic diagram illustrating one embodiment of a memory device 100. Memory device 100 includes a memory array 126 of memory cells, such as a two-dimensional array of memory cells or a three-dimensional array of memory cells. The memory array 126 may include memory cells according to an NAND flash type or NOR flash type architecture. Memory cells in a NAND configuration are accessed as a group and are typically connected in series. A NAND memory array is composed of multiple strings in which each string is composed of multiple memory cells sharing a bit line and accessed as a group. Memory cells in a NOR configuration may be accessed individually. NAND flash and NOR flash memory cells may be configured for long-term storage of information as non-volatile memory retaining information after power on/off cycles. Memory array 126 may also be other types of memory cells programmable to store multiple bits of data per cell as non-volatile memory or volatile memory and may be other types of memory cells in other configurations besides NAND or NOR configurations. Memory device 100 may include multiple dies of memory arrays 126.

Memory array 126 is addressable by word lines via a row decoder 124 and by bit lines via a column decoder 132. Row decoder 124 selects one or more word lines and the column decoder 132 selects one or more bit lines in order to apply appropriate voltages to the respective gates/drains of the addressed memory transistor.

Read/write circuits 128 are provided to read or write (program) the memory states of addressed memory transistors. Read/write circuits 128 include multiple sense modules 130 (sensing circuitry) that allow a page (or other unit) of memory cells to be read or sensed in parallel. Each sense module 130 includes bit line drivers and circuits for sensing.

Control circuitry 110 cooperates with read/write circuits 128 to perform memory operations on memory array 126. Control circuity 110 may include a state machine 112, an on-chip address decoder 114, and a power control module 116. State machine 112 provides chip-level control of memory operations. On-chip address decoder 114 provides an address interface between a host or a memory controller to the hardware address used by decoders 124 and 132. Power control module 116 controls the power and voltages supplied to the word lines and bit lines during memory operations. Control circuitry 110 may include drivers for word lines, source side select lines (SGS), drain side select lines (SGD), and source lines. Control circuitry 110 is also in communication with source control circuits 127, which includes source line driver circuits used to drive varies voltages on the individual source lines.

Memory device 100 includes a controller 122 which operates with a host 80 through a link 120. Commands and data are transferred between a host and controller 122 via a link 120. Link 120 may be via a connection (e.g., a communication path), such as a bus or a wireless connection.

Memory device 100 may be used as storage memory, a main memory, a cache memory, a backup memory, or a redundant memory. Memory device 100 may be an internal storage drive, such as a notebook hard drive or a desktop hard drive. Memory device 100 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Memory device 100 may take the form of an embedded mass storage device, such as an eSD/eMMC embedded flash drive, embedded in host 80. Memory device 100 may also be any other type of internal storage device, removable storage device, embedded storage device, external storage device, or network storage device.

Memory device 100 may be directly coupled to host 80 or may be indirectly coupled to host 80 via a network. For example, the network may include a data center storage system network, an enterprise storage system network, a storage area network, a cloud storage network, a local area network (LAN), a wide area network (WAN), the Internet, and/or another network.

Instructions may be executed by various components of memory device 100, such as by controller 100, controller circuitry 110, row decoder 124, column decoder 132, read/write circuits 128, source control circuits 127, logic gates, switches, latches, application specific integrated circuits (ASICs), programmable logic controllers, embedded microcontrollers, and other components of memory device 100.

Figure 2:
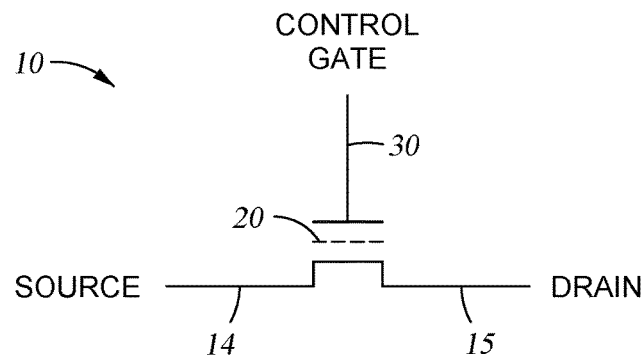
FIG. 2 is a schematic diagram illustrating one embodiment of a flash non-volatile memory cell.

FIG. 2 is a schematic diagram illustrating one embodiment of a flash non-volatile memory cell 10. Memory cell 10 can be implemented by a field-effect transistor having a charge storage unit 20, such as a floating gate or a dielectric layer. Memory cell 10 also includes a source 14, a drain 16, and a control gate 30. A memory state of memory cell 10 may be read by sensing the conduction current across the source and drain electrodes of the cell when a reference voltage is applied to the control gate 30. For each given charge on the floating gate of a cell, a corresponding conduction current with respect to a fixed reference control gate voltage may be detected. A range of charge programmable onto the floating gate defines a corresponding threshold voltage window or a corresponding conduction current window of the memory states of memory cell 10.

Figure 3:
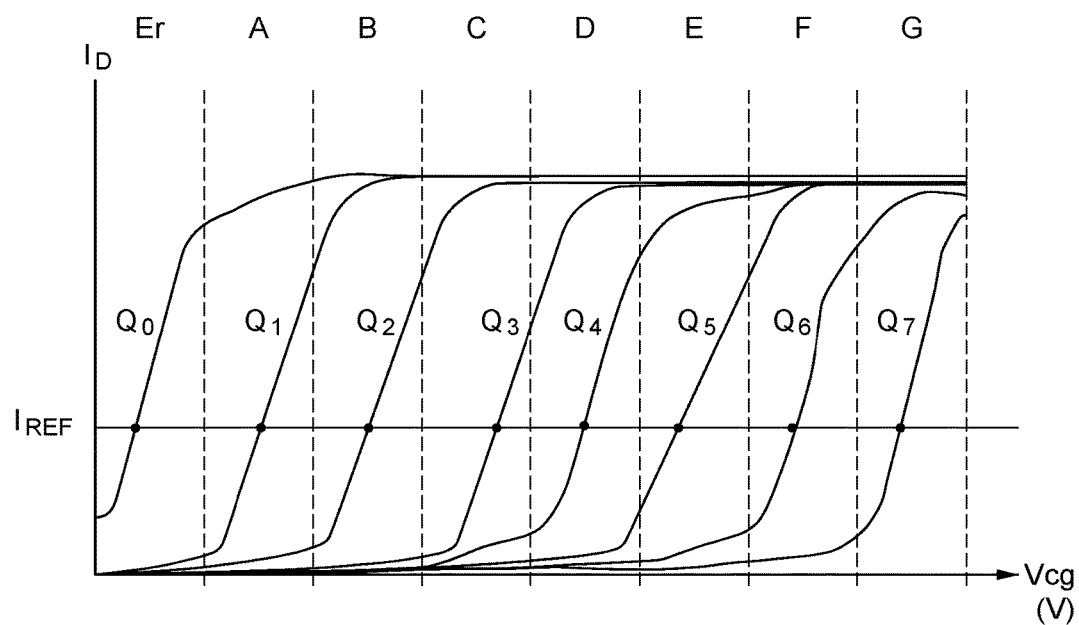
FIG. 3 is a schematic diagram illustrating one embodiment of the relation between a source-drain current and a control gate voltage for eight different charge levels that the floating gate of a memory cell may be selectively storing at any one time.

FIG. 3 is a schematic diagram illustrating one embodiment of the relation between a source-drain current $I_D$ and a control gate voltage $V_{CG}$ for eight different charge levels Q0-Q7 that the floating gate of a memory cell, such as memory cell 10 of FIG. 2, may be selectively storing at any one time. The eight curves represent eight charge levels on a floating gate of a memory cell corresponding to eight possible memory states. Eight possible memory states representing one erased memory state ER and seven programmed states A, B, C, D, E, F, and G may be demarcated by partitioning the threshold window into eight regions. For example, if a reference current $I_{REF}$ is used, then a cell programmed with a charge level Q1 may be considered to be in an A memory state since its curve intersects with $I_{REF}$ in the region of the A threshold voltage window. If a reference current $I_{REF}$ is used, then a cell programmed with a charge level Q3 may be considered to be in a C memory state since its curve intersects with $I_{REF}$ in the region of the C threshold voltage window.

Figure 4:
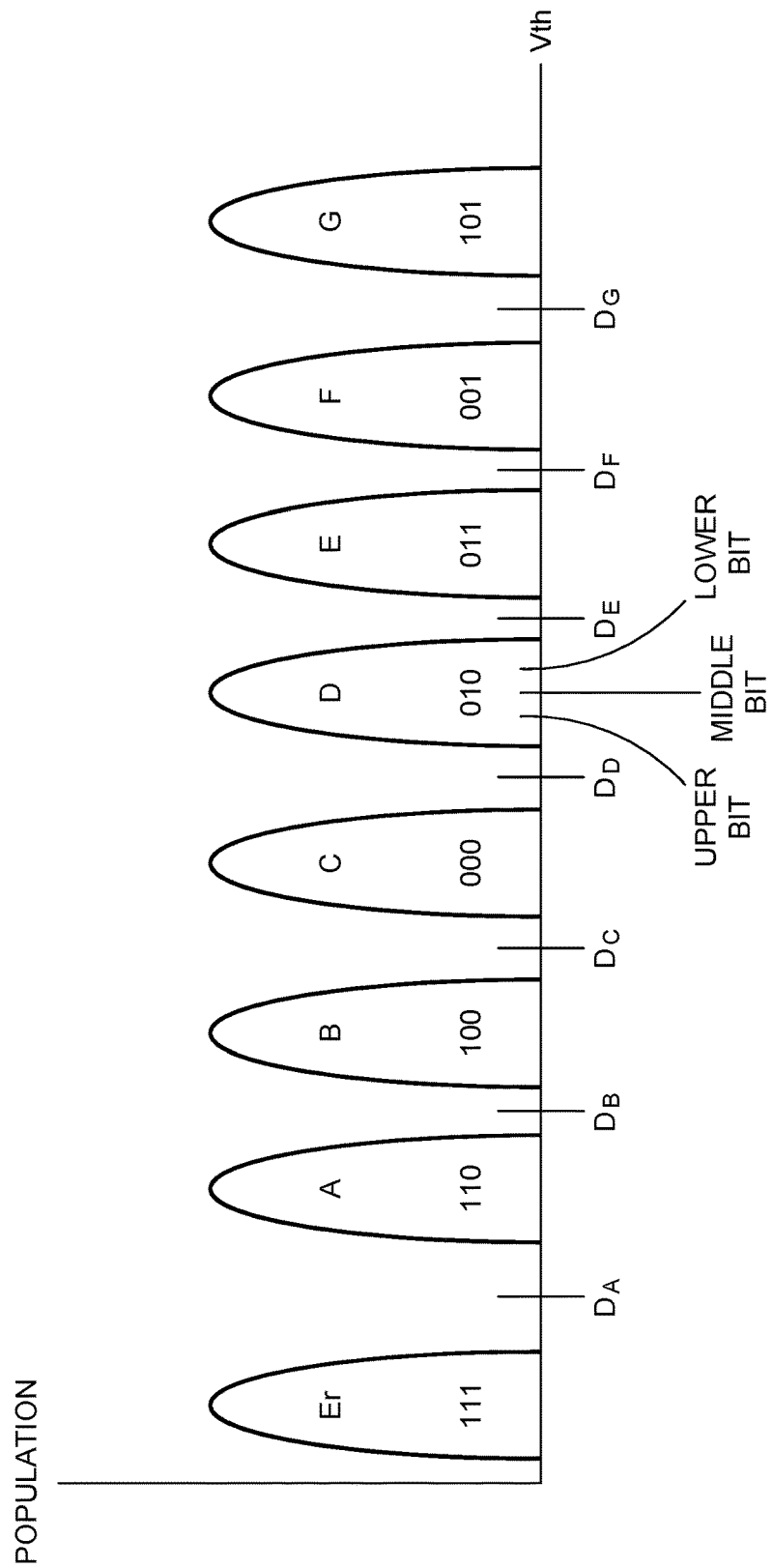
FIG. 4 is a schematic diagram illustrating one embodiment of threshold voltage distributions of a memory array with memory cells operable in eight memory states.

FIG. 4 is a schematic diagram illustrating one embodiment of threshold voltage distributions of a memory array with memory cells operable in eight memory states. The possible threshold voltages of each memory cell spans a threshold window which is partitioned into eight regions to demarcate eight possible memory states, "Er", "A", "B", "C", "D", "E", "F" and "G". "Er" is an erased state or a ground state and "A" through "G" are seven progressively programmed states. During a read operation, the eight states may be demarcated by seven demarcation breakpoints, $D_A$, $D_B$, $D_C$, $D_D$, $D_E$, $D_F$, and $D_G$.

FIG. 4 also shows one embodiment of 3-bit gray coding represented by the eight possible memory states. Each of the eight memory states represented a triplet of upper, middle, and lower bits. In this embodiment, erased memory state represents "111", A memory state represents "110", B memory state represents "100", C memory state represents "000", D memory state represents "010", E memory state represents "011", F memory state represents "001", and G memory state represents "101." The 3 code bits, "lower", "middle" and "upper" bits, may be read or programmed separately. For example, in a first round, the lower bits of the memory cells may be read. In a second round, the middle bits of the memory cells may be read. In a third round, the upper bits of the memory cells may be read. Similarly in programming, in a first round the lower bits of the memory cells may be programmed and verified. In a second round the middle bits of the memory cells may be programmed and verified. In a third round the upper bits of the memory cells may be programmed and verified.

FIGS. 3 and 4 show a memory cell having eight memory states and operating as a triple-level cell (TLC) or X3 cell storing 3 bits/cell. In other embodiments, a memory cell may have more than eight memory states. For example, a memory cell may have sixteen memory states operating as a quadruple-level memory cell (QLC) or X4 cell storing 4 bits/cell.

Figure 5:
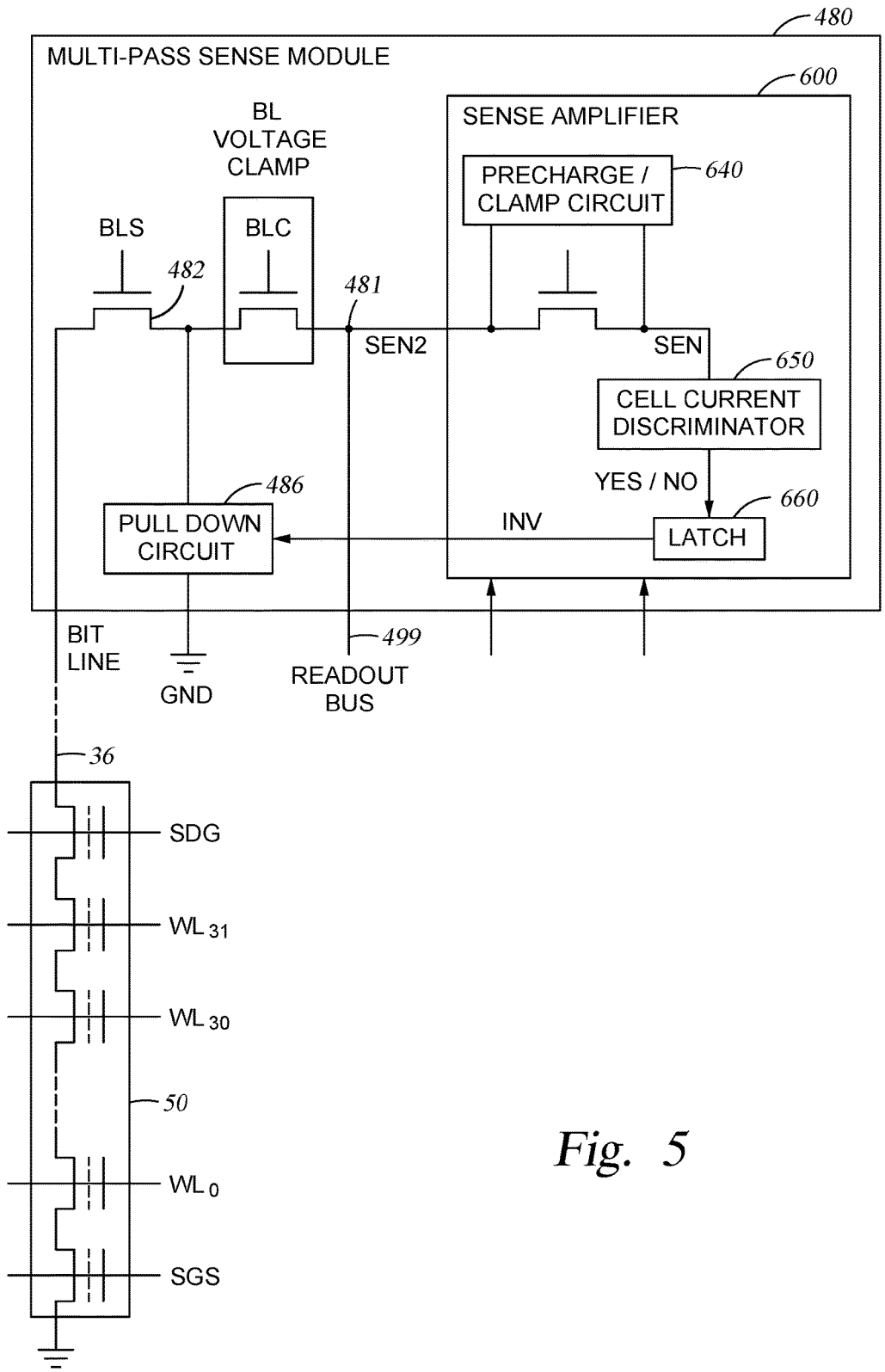
FIG. 5 is a schematic diagram illustrating one embodiment of a sense block for sensing a conduction current of a memory cell for read operations or verify operations.

FIG. 5 is a schematic diagram illustrating one embodiment of a sense module 480 for sensing a conduction current of a NAND memory cell for read operations or verify operations. Sense module 480 senses the conduction current of a memory cell in a NAND chain 50 via a coupled bit line 36. A sense node 481 may be selectively coupled to a bit line, a sense amplifier 600 and a readout bus 499. An isolation transistor 482, when enabled by a signal BLS connects the bit line 36 to the sense node 481. The sense amplifier 600 senses the sense node 481. Sense amplifier 600 may include a precharge/clamp circuit 640 and a cell current discriminator 650. Sense module 480 enables the conduction current of the selected memory cell in the NAND chain to be sensed and the sensed results to be stored in a latch 660. A pull-down circuit 486 may selectively pull bit line 36 (or connect to SGS transistor source node value if NAND chain source is set to non-zero) to ground to enable the locking out of bit lines in a high current state based upon the sensed results.

Figure 6:
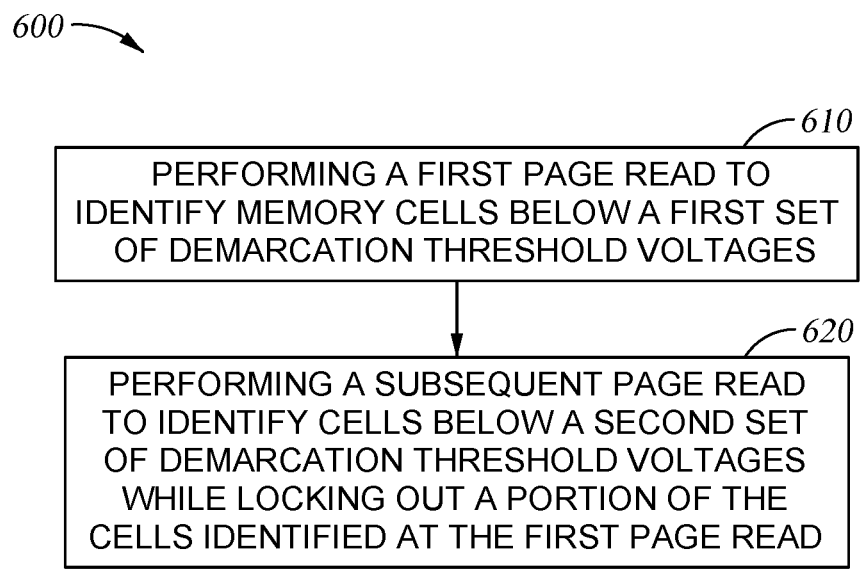
FIG. 6 is a flowchart illustrating one embodiment of a method of sensing the memory states of a memory device.

FIG. 6 is a flowchart illustrating one embodiment of a method 600 of sensing a memory state of the memory cells of a memory device, such as memory device 100 of FIG. 1 and sense module 130, 480 of FIG. 1 and FIG. 5, but other memory devices and sense modules are possible.

In process 610, a first page read may be performed. The first page read includes one or more read levels of a first series of one or more demarcation threshold voltages. The first page read identifies memory cells with threshold voltages below the first series of one or more demarcation threshold voltages.

In process 620, a subsequent page read may be performed. The subsequent page read includes one or more read levels of a second series of one or more demarcation threshold voltages. The subsequent page read identifies memory cells with threshold voltages below the second series of one or more demarcation threshold voltages. During the subsequent page read, a portion of the memory cells identified at process 610 are locked out during one or more of the read levels in the subsequent page read. During the subsequent page read, a portion of the memory cells identified in a prior read level in the current page read may also be locked out during subsequent read levels in the current page read.

Method 600 may be used to reduce $I_{CC}$ or current consumed by memory array 126 or memory die during read operations. In read operations of more than one page read, memory cells identified in a first page read may be locked out in a subsequent page read to conserve current consumed. Prior page read information alone or in combination with prior read level information in a current page read may be used to lockout additional number of memory cells during a current page read to reduce Icc during a read operation.

FIG. 7A is a read level chart 700 illustrating one embodiment of a read operation utilizing the method 600 of FIG. 6. Read level chart 700 illustrates a read operation discerning the lower bits, middle bits, and upper bits of the 8-state memory encoded with a Gray code of FIG. 4 using a 2-3-2 read scheme. The read scheme includes three pages of reads of a lower page read, a middle page read, and an upper page read. In the lower page read, two demarcation threshold voltages are provided to identify memory cells with two read levels to discern the lower bits. In the middle page read, three demarcation threshold voltages are provides to identify memory cells with three read levels to discern the middle bits. In the upper page read, two demarcation threshold voltages are provides to identify memory cells with two read levels to discern the upper bits. In the read scheme, certain memory cells in certain memory states are locked out during a read level so that power is not drained unnecessarily. Memory cells may be locked out by inhibiting the conductive cells or by having their conduction currents turned off by grounding their bit lines (or connect to SGS transistor source node value if NAND string source is set to non-zero).

FIG. 7B is a table 750 illustrating one embodiment of locking out or inhibiting conducting cells during a read level to reduce $I_{CC}$ during a read operation following a read scheme of read level chart 700 of FIG. 7A. The entry "c" represents non-inhibited conductive cells during a particular read level. The entry "nc" represents non-conductive cells during a particular read level. The entry "ic" represents inhibited conductive cells during a particular read level. These cells are identified based on a prior read level from the same page this is being read. The entry "eic" represents extra or additional inhibited conductive cells during a particular read level in which the extra or additional inhibited conductive cells are identified from a prior read level from a prior page read.

A lower page read comprising a two level read with a first level A read relative to demarcation of $D_A$ and a second level E read relative to demarcation threshold voltage $D_E$, may discern the lower bits of the memory cells. In the first level A read, those memory cells with programmed threshold voltages less than the demarcation threshold voltage $D_A$ are detected. In the second level E read, those memory cells with programmed threshold voltages less than the demarcation threshold voltage $D_E$ are detected. In the second level E read, Erased state memory cells previously identified under A read from the current lower page read may be locked out during E read.

A middle page read comprising a three level read with a first level B read relative to demarcation threshold voltage of $D_B$, a second level D read relative to demarcation threshold voltage $D_D$, and a third level F read relative to demarcation threshold $D_F$ may discern the middle bits of the memory cells. In the first level B read, those memory cells with programmed threshold voltages less than the demarcation threshold voltage $D_B$ are detected. In the first level B read, Erased state memory cells previously identified under A read in the prior lower page read are locked out. In the second level D read, those memory cells with programmed threshold voltages less than the demarcation threshold voltage $D_D$ are detected. In the second level D read, Erased and A state memory cells previously identified under B read in the current middle page may be locked our during D read. In the third level F read, those memory cells with programmed threshold voltages less than the demarcation threshold voltage $D_F$ are detected. In the third level F read, Erased, A, B, C, and D state memory cells previously identified under E read from the prior lower page read may be locked out during F read.

An upper page read comprising a two level read with a first level C read relative to demarcation of $D_C$ and a second level G read relative to demarcation threshold voltage $D_G$ may discern the upper bits. In the first level C read, those memory cells with programmed threshold voltages less than the demarcation threshold voltage D, are detected. In the first level C read, Erased and A state memory cells previously identified under B read from the prior middle page read may be locked out during C read. In the second level G read, those memory cells with programmed threshold voltages less than the demarcation threshold voltage $D_G$ are detected. In the second level G read, Erased, A, B, C, D, and E previously detected under F read from prior middle page read may be locked out.

Locking out additional memory cells identified in a prior read level from a prior page read as compared to only locking out memory cells identified in a prior level from a current page read reduces the number of cells sensed and reduces the Icc or power consumed. Column 760 of table 750 indicates the fraction or percentage of additional memory states locked out using prior read level from a prior page read relative to the remaining conductive memory states identified simply by using a prior read level from a current page read. The additional memory states locked out are identified from a prior read level for a prior page read which could not have been identified from a prior level in a current page read.

For example, in B read in a middle page read, additional Erased state conductive memory cells may be locked out. The additional Erased state memory cells are identified from the prior lower page A read. No additional memory cells could have been identified in the current middle page read without a prior read level or without a prior dummy read in the current middle page read. In B read, the sense operation is sensing two memory states of conducting Erased and A state memory cells if memory state information is only used from the current middle page read. In B read, the sense operation is sensing one memory state of conducting A state memory cells if Erased state memory cells identified in the prior lower page A read are locked out. Therefore, utilizing memory state information in a prior lower page A read in comparison to a current middle page read results in locking out one additional memory state out of two conducting memory states sensed in the B read.

For example, in F read in a middle page read, additional D state conductive memory cells may be locked out as well as locking out Erased, A, B, and C state conducting memory cells. The additional D state memory cells as well as Erased, A, B, and C state conducting memory cells may be identified from the lower page read E. Erased, A, B, and C state conducting memory cells could have also been identified in the prior level D read of the current middle page read. In F read, the sense operation is sensing two memory states of the conducting D and E state memory cells if only memory cells identified in the prior D level read of the current page read are locked out. In F read, the sense operation is sensing one conducting memory cell state in an E memory state if D state memory cells identified in the prior lower page E read are locked out. Therefore, utilizing memory state information in a prior lower E page read in comparison to a prior D read level in a current middle page read results in locking out one additional memory state out of two conducting memory states sensed in the F read.

For example, in C read in an upper page read, additional Erased and A state conductive memory cells may be locked out. The additional Erased and A state memory cells are identified from the middle page B read. No additional memory cells could have been identified in the current upper page read without a prior read level or without a dummy read in the current upper page read. In C read, the sense operation is sensing three memory states of the conducting Erased, A, and B state memory cells if memory state information is only used from the current upper page read. In C read, the sense operation is sensing one memory state of conducting B state memory cells if Erased and A state memory cells identified in the prior middle page B read level are locked out. Therefore, utilizing information in a prior middle page B read level in comparison to a current upper page read results in locking out two additional memory states out of the three conductive memory states sensed in the C read.

For example, in G read in a upper page read, additional C, D, and E state conductive memory cells may be locked out as well as locking out Erased, A, and B state conducting memory cells. The additional C, D, and E state memory cells as well as Erased, A, and B state conducting memory cells may be identified from the middle page F read. Erased, A, and B state conducting memory cells could have also been identified in the prior level of the current upper page C read. In G read, the sense operation is sensing four memory states of the conducting C, D, E, and F state memory cells if only memory cells identified in the current upper page read are locked out. In G read, the sense operation is sensing one conducting memory cell state in an F memory state if C, D, and E state memory cells identified in the prior middle page F read are additionally locked out. Therefore, utilizing information in a prior middle page F read in comparison to a prior C read level in a current upper page read results in locking out three additional memory states out of four conductive memory states sensed in the G read.

Figure 8:
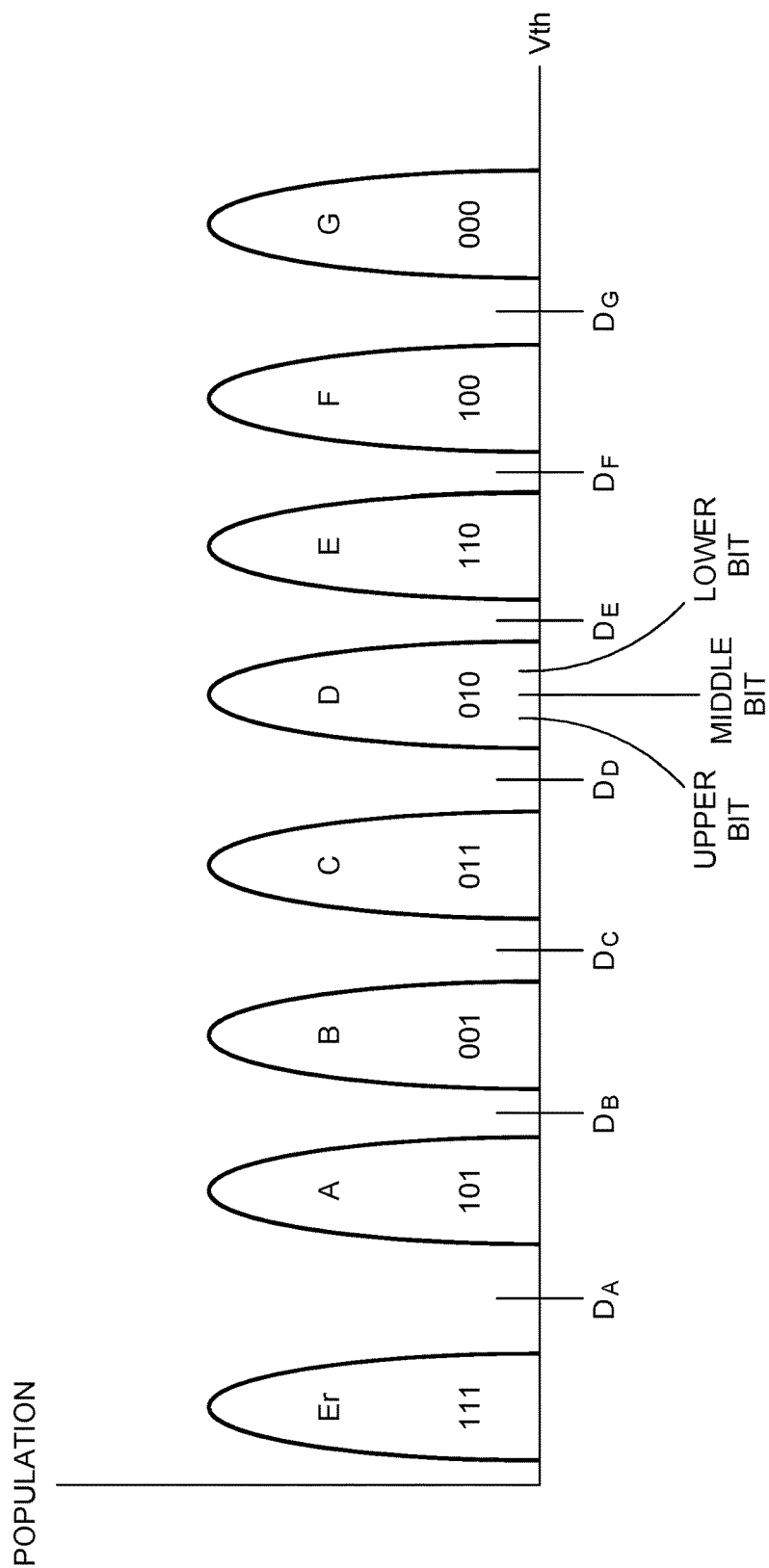
FIG. 8 is a schematic diagram illustrating another embodiment of 3-bit gray coding represented by eight memory states.

FIG. 8 is a schematic diagram illustrating another embodiment of 3-bit gray coding represented by the eight memory states. In this embodiment, Erased memory state represents "111", A memory state represents "101", B memory state represents "001", C memory state represents "011", D memory state represents "010", E memory state E represents "110", F memory state represents "100", and G memory state represents "000." The 3 code bits, "lower", "middle" and "upper" bits, may be read or programmed separately. For example, in a first round, the lower bits of the memory cells may be read. In a second round, the middle bits of the memory cells may be read. In a third round, the upper bits of the memory cells may be read. Similarly in programming, in a first round the lower bits of the memory cells may be programmed and verified. In a second round the middle bits of the memory cells may be programmed and verified. In a third round the upper bits of the memory cells may be programmed and verified.

FIG. 9A is a schematic read level chart 900 illustrating one embodiment of a read operation utilizing the method 600 of FIG. 6. Read level chart 900 illustrates a read operation discerning the lower bits, middle bits, and upper bits of the 8-state memory encoded with a Gray code of FIG. 8 using a 1-3-3 read scheme. The read scheme includes three pages of reads of a lower page read, a middle page read, and an upper page read. In the lower page read, one demarcation threshold voltage is provided to identify memory cells with one read level to discern the lower bits. In the middle page read, three demarcation threshold voltages are provides to identify memory cells with three read levels to discern the middle bits. In the upper page read, three demarcation threshold voltages are provides to identify memory cells with three read levels to discern the upper bits. In the read scheme, certain memory cells in certain memory states are locked out during a read level so that power is not drained unnecessarily. Memory cells may be locked out by inhibiting the conductive cells or by having their conduction currents turned off by grounding their bit lines.

FIG. 9B is a table 750 illustrating one embodiment of locking out or inhibiting conducting cells during a read level to reduce ICC during a read operation following a read scheme of read level chart 900 of FIG. 9A. The entry "c" represents non-inhibited conductive cells during a particular read level. The entry "nc" represents non-conductive cells during a particular read level. The entry "ic" represents inhibited conductive cells during a particular read level. The entry "eic" represents extra or additional inhibited conductive cells during a particular read level in which the extra or additional inhibited conductive cells are identified from a prior read level from prior page read.

A lower page read comprising one read level with a single level D read relative to demarcation of $D_D$ may discern the the lower bits of the memory cells. In the single D read, those memory cells with programmed threshold voltages less than the demarcation threshold voltage $D_D$ are detected.

A middle page read comprising a three level read with a first level A read relative to demarcation threshold voltage of $D_A$, a second level C read relative to demarcation threshold voltage $D_C$, and a third level F read relative to demarcation threshold $D_F$ may discern the middle bits of the memory cells. In the first level A read, those memory cells with programmed threshold voltages less than the demarcation threshold voltage $D_A$ are detected. In the first level A read, no memory cells are locked out. In the second level C read, those memory cells with programmed threshold voltages less than the demarcation threshold voltage $D_C$ are detected. In the second level C read, Erased state memory cells previously identified under A read in the current middle page may be locked our during C read. In the third level F read, those memory cells with programmed threshold voltages less than the demarcation threshold voltage $D_F$ are detected. In the third level of read F, Erased, A, B, and C state memory cells previously identified under D read from the prior lower page read may be locked out during F read.

An upper page read comprising a three level read with a first level B read relative to demarcation of $D_B$, a second level E read relative to demarcation threshold voltage $D_E$, and a third level G read relative to demarcation of $D_G$ may discern the upper bits. In the first level B read, those memory cells with programmed threshold voltages less than the demarcation threshold voltage $D_B$ are detected. In the first level B read, Erased state memory cells previously identified under A read from the prior middle page read may be locked out during B read. In the second level E read, those memory cells with programmed threshold voltages less than the demarcation threshold voltage $D_E$ are detected. In the second level E read, Erased, A, B, and C state memory cells previously detected under D read from prior lower page read may be locked out. In the third level G read, those memory cells with programmed threshold voltages less than the demarcation threshold voltage $D_G$ are detected. In the third level G read, Erased, A, B, C, D, and E previously detected under F read from prior middle page read may be locked out.

Locking out additional memory cells identified in a prior read level from a prior page read as compared to locking out memory cells identified in a prior level from a current page reduces the number of cells sensed and reduces the Icc or power consumed. Column 960 of table 950 indicates the fraction or percentage of additional memory states locked using prior read level from a prior page read relative the remaining conductive states identified simply by using a prior read level from current page read. The additional memory states locked out are identified from a prior read level which could not have been identified from a prior level in a page read.

For example, in F read in a middle page read, additional C state conductive memory cells may be locked out as well as locking out Erased, A, and B state conducting memory cells. The additional C state memory cells as well as Erased, A, and B state conducting memory cells may be identified from the lower page D read. Erased, A, and B state conducting memory cells could have also been identified in the prior level C read of the current middle page read. In F read, the sense operation is sensing three memory states of the conducting C, D, and E state memory cells if only memory cells identified in the prior C level read of the current page read are locked out. In F read, the sense operation is sensing two conducting memory cell states in a D or E memory state if addition C state memory cells identified in the prior lower page D read are locked out. Therefore, utilizing memory state information in a prior lower page D read in comparison to a prior C read level in a current middle page read results in locking out one additional memory state out of three conducting memory states sensed in the F read.

For example, in B read in an upper page read, additional conductive memory cells in Erased memory states may be locked out. The additional Erased state memory cells are identified from the middle page A read. No additional memory cells could have been identified in the current upper page read without a prior read level or a without a prior dummy read in the current middle page read. In B read, the sense operation is sensing two memory states of conducting Erased and A state memory cells if memory state information is only used from the current upper page read. In B read, the sense operation is sensing one memory state of conducting A state memory cells if Erased state memory cells identified in the prior middle page A read are locked out. Therefore, utilizing memory state information in a prior middle page A read in comparison to a current upper read results in locking out one additional memory state out of two conducting memory states sensed in the B read.

For example, in E read in an upper page read, additional B and C state conductive memory cells may be locked out as well as locking out Erased and A state conducting memory cells. The additional B and C state memory cells as well as Erased and A state conducting memory cells may be identified from the lower page D read. Erased and A state conducting memory cells could have also been identified in the prior level of the current upper page B read. In E read, the sense operation is sensing three memory states of the conducting B, C, and E state memory cells if only memory cells identified in the current upper page B read level are locked out. In E read, the sense operation is sensing one memory state of conducting D state memory cells if additional B and C state memory cells identified in the prior lower page D read are additionally locked out. Therefore, utilizing information in a prior lower page D read in comparison to a prior B read level in a current upper page read results in locking out two additional memory states out of three conductive memory states sensed in the E read.

For example, in G read in a upper page read, additional E state conductive memory cells may be locked out as well as locking out Erased, A, B, C, and D state conducting memory cells. The additional E state memory cells as well as Erased, A, B, C, and D state conducting memory cells are identified from the middle page F read. Erased, A, B, C, and D state conducting memory cells could have also been identified in the prior level of the current upper page E read. In G read, the sense operation is sensing two memory states of the conducting E and F state memory cells if only memory cells identified in the current upper page E read level are locked out. In G read, the sense operation is sensing one conducting memory cell state in an F memory state if additional E state memory cells identified in the prior middle page F read are additionally locked out. Therefore, utilizing information in a prior middle page F read in comparison to a prior E read level in a current upper page read results in locking out one additional memory states out of two conductive memory states sensed in the G read.

Figure 10:
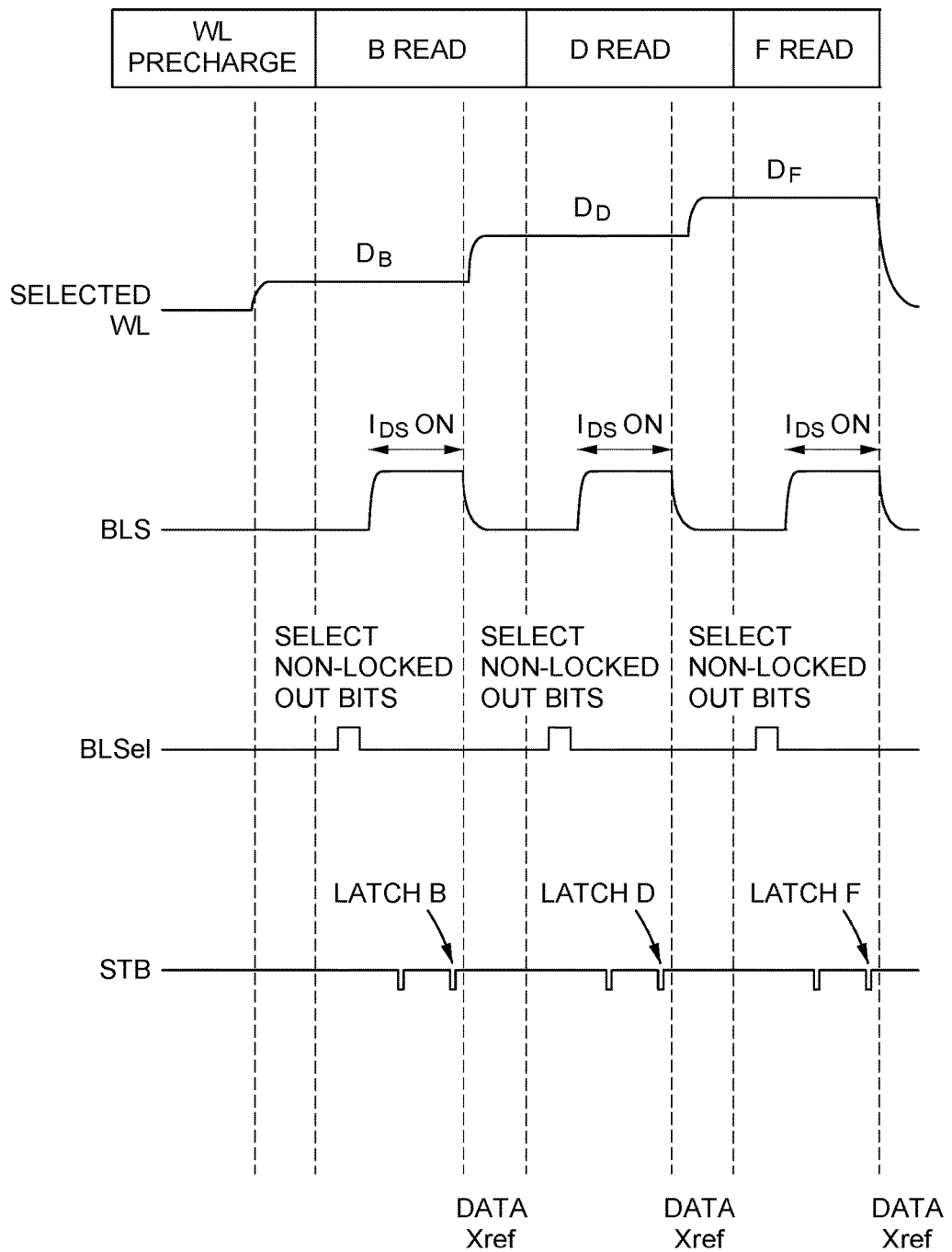
FIG. 10 is a schematic timing diagram of one embodiment of a read operation by a sensing module To facilitate understanding, identical reference numerals have been used, where possible, to designate identical elements that are common to the figures. It is contemplated that elements disclosed in one embodiment may be beneficially utilized on other embodiments without specific recitation.

FIG. 10 is a schematic timing diagram of one embodiment of a read operation by sense module 130, 480 of FIG. 1 and FIG. 5, but other memory devices and sense modules are possible. Timing diagram will be described in reference to middle page read of the 2-3-2 read scheme of FIGS. 7A-7B. This example shows a 3-level read of B read, D read, and F read relative to demarcation threshold voltage of $D_B$, demarcation threshold voltage $D_D$, and demarcation threshold $D_F$ respectively. At the beginning of each read level, the memory cells which are not locked out will have their bit lines selected for precharged. The locked out memory cells will be discharged to ground. Selected word lines signal are supplied a voltage to the control gate of the selected cell in the NAND string to set a demarcation threshold voltage, such as a demarcation threshold voltage $D_B$ in anticipation of the B read suboperation. A strobe signal STB enables a latching of the results of the read suboperation.

For example, in B read of the read scheme of FIGS. 7A-7B, Erased state memory cells are locked out utilizing memory state information from Latch A from an A read sub-operation from the lower page read. In D read, Erased and A state memory cells are locked out utilizing memory state information from Latch A from an A read sub-operation from the lower page read and from Latch B from a B read sub-operation from the current middle page read. In F read, Erased, A, B, C, and state memory cells are locked out utilizing memory state information from Latch A from an A read sub-operation from the lower page read and from Latch E from a E read sub-operation from the lower page read. In general, the number of data latches depends on the design architecture of the circuit. A data latch may store information of a plurality of memory states of a page read.

In certain embodiments, the term identifying memory cells in a read level may include those memory cells that are locked out since those memory cells should have been identified in the read level. In certain embodiments, it is understood that locking out memory cells in a read level may utilize information or latches from one or more prior read levels from a prior page read alone or in combination with a current page read.

Memory cells may have threshold voltage windows partitioned into several regions representing several memory states. The regions are demarcated by a set of demarcation threshold voltages. Comparing the programmed threshold voltage with a plurality of demarcation threshold voltages when sensing a memory cell determines in which region the programmed threshold voltage lies. At a subsequent page read, the memory cells with programmed threshold voltages lower than the current demarcation threshold voltage can be identified from a prior page read and can be locked out. Thus, turning-off or inhibiting the conduction current of the previously identified memory cells from prior page reads (alone or in combination with previously identified memory cells form a prior read level from a current page read) reduces the current and power consumed.

Embodiments of memory devices and sensing methods have been described in reference to memory cells having eight memory states and operating as a triple-level cell (TLC) or X3 cell storing 3 bits/cell. Embodiments of memory devices and sensing methods are also applicable to memory cells may have more than eight memory states, such as sixteen memory states operating as a quadruple-level memory cell (QLC) or X4 cell storing 4 bits/cell.

While the foregoing is directed to embodiments of the present disclosure, other and further embodiments of the disclosure may be devised without departing from the basic scope thereof, and the scope thereof is determined by the claims that follow.

What is claimed is:

1. A method of sensing a page of memory cells in an array, wherein each memory cell is programmable to a threshold voltage corresponding to one of multiple memory states, comprising:
   providing a first series of one or more demarcation threshold voltages for demarcating between memory states in a first page read discerning a first bits of the page of memory cells, the first page read selected from a group consisting of a lower page read and a middle page read;
   identifying one or more sets of memory cells demarcated between the one or more demarcation threshold voltages of the first series in the first page read;
   providing a second series of one or more demarcation threshold voltages for demarcating between memory states in a second page read discerning a second bits of the page of memory cells, the second page read selected from a group consisting of the middle page read and a upper page read, the second page read is different than the first page read;

inhibiting conduction currents of the one or more sets of memory cells identified by the first series from the first page read, wherein the conduction currents are inhibited during the second series of the one or more demarcation threshold voltages in the second page read; and identifying one or more sets of memory cells demarcated between the one or more demarcation threshold voltages of the second series in the second page read.

2. The method of claim 1, wherein the one or more sets of memory cells demarcated between the one or more demarcation threshold voltages of the first series are identified by sensing a high conduction current.

3. The method of claim 1, wherein the multiple memory states are eight or more memory states.

4. The method of claim 1, wherein the conduction currents of the one or more sets of memory cells are inhibited by grounding bit lines coupled to the inhibited one or more sets of memory cells.

5. The method of claim 1, wherein the one or more sets of memory cells identified by the first series of demarcation threshold voltages and wherein the one or more sets of memory cells identified by the second series of demarcation threshold voltages are part of a read operation.

6. The method of claim 1, wherein the one or more sets of memory cells identified by the first series of demarcation threshold voltages and wherein the one or more sets of memory cells identified by the second series of demarcation threshold voltages are part of a program-verify operations.

7. A method of sensing a page of memory cells in an array, wherein each memory cell is programmable to a threshold voltage corresponding to one of multiple memory states, comprising:

conducting a lower page read of one or more demarcation threshold voltages of the page of memory cells;

conducting a middle page read of one or more demarcation threshold voltages of the page of memory cells, wherein memory cells identified from the lower page read are selectively locked out during the middle page read; and conducting an upper page read of one or more demarcation threshold voltages of the page of memory cells, wherein memory cells identified from a prior page read are selectively locked out during the upper page read.

8. The method of claim 7, wherein the selective locked out memory cells identified from the prior page read are identified from the lower page read.

9. A method of sensing a plurality of memory cells in an array, wherein each memory cell is programmable to a threshold voltage corresponding to one of multiple memory states, comprising:

conducting a lower page read of one or more demarcation threshold voltages;

conducting a middle page read of one or more demarcation threshold voltages, wherein memory cells identified from the lower page read are selectively locked out during the middle page read; and conducting an upper page read of one or more demarcation threshold voltages, wherein memory cells identified from a prior page read are selectively locked out during the upper page read, wherein the selective locked out memory cells identified from the prior page read are identified from the middle page read.

10. A method of sensing a plurality of memory cells in an array, wherein each memory cell is programmable to a threshold voltage corresponding to one of multiple memory states, comprising:

conducting a lower page read of one or more demarcation threshold voltages;

conducting a middle page read of one or more demarcation threshold voltages, wherein memory cells identified from the lower page read are selectively locked out during the middle page read; and conducting an upper page read of one or more demarcation threshold voltages, wherein memory cells identified from a prior page read are selectively locked out during the upper page read, wherein the selective locked out memory cells identified from the prior page read are identified from the lower page read and the middle page read.

11. A method of sensing a plurality of memory cells in an array, wherein each memory cell is programmable to a threshold voltage corresponding to one of multiple memory states, comprising:

conducting a lower page read of one or more demarcation threshold voltages;

conducting a middle page read of one or more demarcation threshold voltages, wherein memory cells identified from the lower page read are selectively locked out during the middle page read; and conducting an upper page read of one or more demarcation threshold voltages, wherein memory cells identified from a prior page read are selectively locked out during the upper page read, wherein the memory cells are selectively locked out during the middle page read and during the upper page read out by selectively inhibiting a conduction current of the memory cells.

12. A method of sensing a plurality of memory cells in an array, wherein each memory cell is programmable to a threshold voltage corresponding to one of multiple memory states, comprising:

conducting a lower page read of one or more demarcation threshold voltages;

conducting a middle page read of one or more demarcation threshold voltages, wherein memory cells identified from the lower page read are selectively locked out during the middle page read; and conducting an upper page read of one or more demarcation threshold voltages, wherein memory cells identified from a prior page read are selectively locked out during the upper page read, wherein the memory cells are selectively locked out during the middle page read and during the upper page read out by selectively grounding their bit lines.

13. A memory device, comprising;

a page of memory cells accessible by a plurality of bit lines and a plurality of word lines;

a plurality of sensing circuits sensing conduction current in a portion of the page of memory cells in a current page read to determine a first bits of the page of memory cells; and a bit-line grounding circuit for each sensing circuit to ground associated bit lines to the portion of the plurality of memory cells during a subsequent page read of the page of memory cells to determine a second bits of the page of memory cells.

14. The memory device of claim 13, wherein a series of demarcation threshold voltages are supplied over multiple read pages.

15. The memory device of claim 13, wherein each memory cell may store a charge level corresponding to eight or more memory states.

16. The memory device of claim 13, wherein each memory cell may store at least three bits of data.

17. The memory device of claim 13, wherein the memory cells are configured in a NAND configuration.

18. The memory device of claim 13, wherein the associated bit lines to the portion of the page of memory cells determined in the current page read are grounded to inhibit conduction currents during the subsequent page read of the page of memory cells.

19. A memory device, comprising;
a page of memory cells accessible by a plurality of bit lines and a plurality of word lines, wherein each memory cell may store a charge level corresponding to eight or more memory states;
a sensing means operable to perform a lower page read, a middle page read, and an upper page read; and
a lockout means operable to lockout a portion of the memory cells during a current page read selected from a group consisting of the middle page read and the upper page read, the portion of the memory cells identified from a prior page read selected from a group consisting of the lower page read and the middle page read, the prior page read is different than the current page read.

20. The memory device of claim 19, wherein the current page read is the middle page read and the prior page read is the lower page read.

21. The memory device of claim 19, wherein the current page read is the upper page read and the prior page read is the lower page read.

22. The memory device of claim 19, wherein the lock means reduces current consumption.

23. A memory device, comprising;
an array of memory cells accessible by a plurality of bit lines and a plurality of word lines, wherein each memory cell may store a charge level corresponding to eight or more memory states;
a sensing means operable to perform a lower page read, a middle page read, and an upper page read; and
a lockout means operable to lockout a portion of the memory cells during a current page read, the portion of the memory cells identified from a prior page read, wherein the current page read is the upper page read and the prior page read is the middle page read.

24. A memory device, comprising;
an array of memory cells accessible by a plurality of bit lines and a plurality of word lines, wherein each memory cell may store a charge level corresponding to eight or more memory states;
a sensing means operable to perform a lower page read, a middle page read, and an upper page read; and
a lockout means operable to lockout a portion of the memory cells during a current page read, the portion of the memory cells identified from a prior page read, wherein the current page read is the upper page read and the prior page read is both the lower page read and the middle page read.

* * * * *